United States Patent [19]

Jeong

[11] Patent Number: 5,278,655
[45] Date of Patent: Jan. 11, 1994

[54] AUTOMATIC CHANNEL MATCHING SYSTEM AND METHOD THEREOF

[75] Inventor: Se-yeong Jeong, Suwon, Rep. of Korea

[73] Assignee: Samsung Electronics Co., Ltd., Rep. of Korea

[21] Appl. No.: 875,269

[22] Filed: Apr. 28, 1992

[30] Foreign Application Priority Data

Jul. 8, 1991 [KR] Rep. of Korea ............... 91-10366
Mar. 16, 1992 [KR] Rep. of Korea ............... 92-4296

[51] Int. Cl.⁵ ............................................. H04N 5/50
[52] U.S. Cl. ........................... 358/191.1; 358/193.1; 455/161.3; 455/182.3
[58] Field of Search ............... 358/191.1, 192.1, 193.1, 358/195.1, 181, 160, 335, 310, 315, 188; 455/188.2, 184.1, 186.1, 182.1, 182.3, 188.1, 161.1, 165.1, 161.3; H04N 5/50

[56] References Cited

U.S. PATENT DOCUMENTS 4,763,195 8/1988 Tults .................... 358/193.1
5,029,015 7/1991 Baxter .................. 358/191.1

Primary Examiner—Mark R. Powell
Assistant Examiner—Michael H. Lee
Attorney, Agent, or Firm—Sughrue, Mion, Zinn, Macpeak & Seas

[57] ABSTRACT

An automatic channel matching system for viewing a video signal produced by a VCR at any channel at which a TV is tuned without changing the TV channel when in a VCR mode. A coarse tuning operation is first performed when receiving a VCR mode control signal by the system, which includes an RF channel frequency altering unit for variably generating a carrier wave frequency while shifting from a low channel frequency to a high channel frequency by a predetermined frequency bandwidth, generating a fixed current carrier wave frequency when the level of a detected synchronizing signal is higher than the level of noise in the signal output from a synchronizing signal detector, and generating a fixed carrier wave frequency tuned to match the channel frequency according to the output of a noise signal level converting unit.

28 Claims, 2 Drawing Sheets

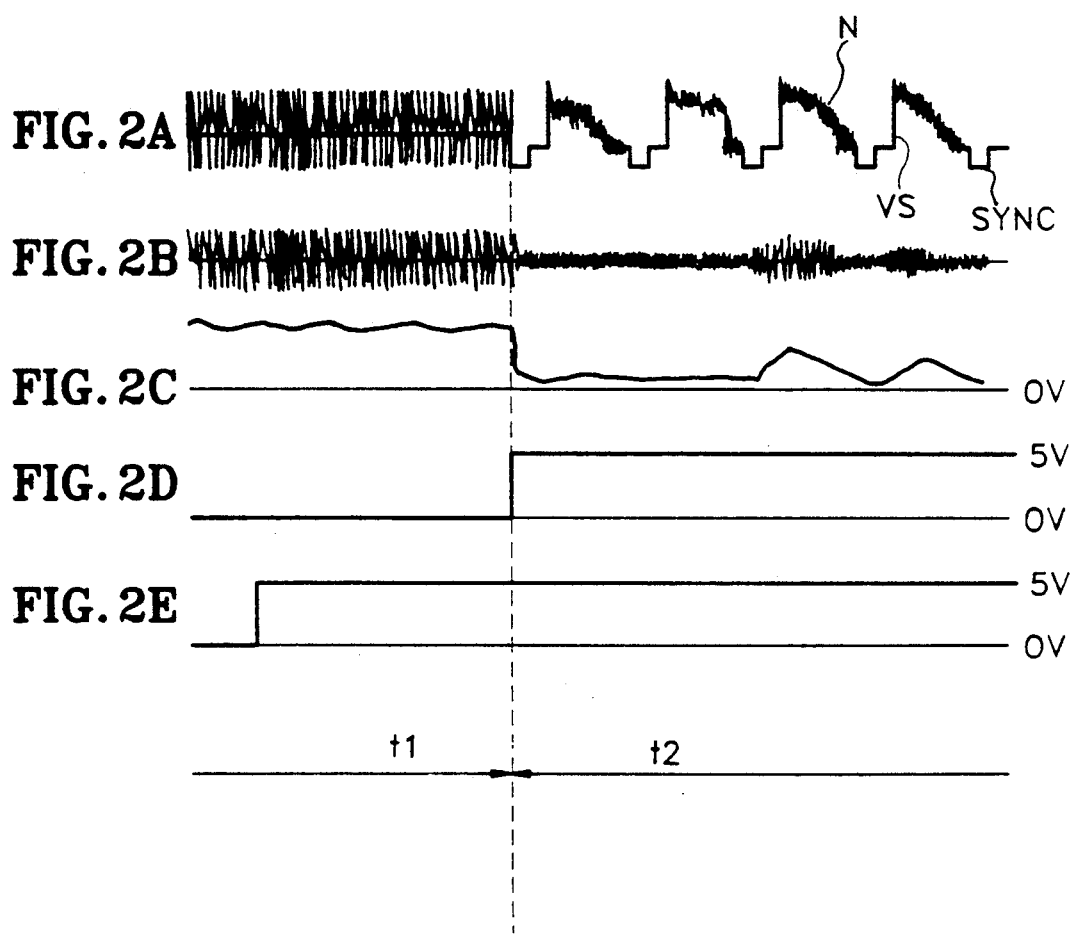

AUTOMATIC CHANNEL MATCHING SYSTEM AND METHOD THEREOF

BACKGROUND OF THE INVENTION

The present invention relates to an automatic channel matching system and method thereof for enabling the user to view an audio/video signal from a video cassette recorder (VCR) on any channel of a television (TV) without altering or preselecting the TV's channel during a VCR mode, and more particularly, to such a system and method thereof in which, by varying the output frequency band of a VCR, the frequency band of a currently audio-visual TV is accorded therewith, so as to be automatically matched with the TV channel.

Generally in conventional VCRS, since the frequency of an RF channel is fixed to the frequency of one of two TV channels (e.g., 3 or 4), a user must set the TV channel to 3 or 4 in order to view the audio/video signal output from the VCR via the TV. Therefore, when viewing a TV channel besides 3 or 4, a user must separately alter the TV channel in order to view the audio/video signal from the VCR.

SUMMARY OF THE INVENTION

An object of the present invention is to provide an automatic channel matching system and a method thereof for allowing a user to view the audio/video signal of a VCR on any TV channel, by varying the carrier frequency of the audio/video signal of the VCR so as to be automatically matched with the TV channel frequency currently viewed by the user.

Accordingly, to achieve the above object, there is provided an automatic channel matching system of the present invention, connected between a TV having a tuner, signal processing means for processing a video signal input via the tuner, and an output terminal for externally providing the output signal of the signal processing means and a VCR which reproduces and processes a video signal from a recording medium and outputs the result, the system comprising:

a first input terminal for receiving the video signal supplied from the VCR;

a second input terminal for receiving a TV/VCR mode control signal;

an RF channel frequency altering unit connected to the first and second input terminals, for variably or fixedly generating a carrier wave frequency to first perform coarse tuning and then perform fine tuning, loading the video signal on the generated carrier wave frequency and transmitting the loaded video signal to the TV; and a synchronizing signal detector connected to the output terminal of the TV for detecting a synchronizing signal among an output signal from the output terminal of the TV, whereby the carrier wave frequency of the RF channel altering unit is accorded with the currently viewed TV channel frequency in response to the synchronizing signal detected in the synchronizing signal detector, so that a user can view the video signal from the VCR via the frequency of the currently viewed channel of the TV.

Preferably, the automatic channel matching system further comprises a noise detecting unit connected to the output of the TV for detecting only a noise signal among the signals output from the output terminal of the TV, and a noise level converting unit for amplifying the noise signal detected from the noise detecting unit to a predetermined level and then converting the amplified noise signal into a signal having a DC component, wherein the RF channel frequency altering unit generates a carrier wave frequency for fine tuning according to the output of the noise level converting unit.

The RF channel altering unit preferably comprises: a carrier wave frequency oscillator connected to the second input terminal, for variably generating a carrier wave frequency from a low channel to a high channel upon receiving a VCR mode control signal and then for generating the carrier wave frequency to perform the coarse tuning upon receiving a signal in a predetermined level from the synchronizing signal detector; and a multiplier for multiplying the video signal received via the first input terminal and the carrier wave frequency generated from the carrier wave frequency oscillator and transmitting the added signal to the tuner of the TV.

Also, the noise detecting unit preferably comprises a buffer for buffering the signal output from the output terminal of the TV, an inverting buffer for inverting while buffering the signal output from the output terminal of the TV, and an adder for adding the outputs of the buffer and the inverting buffer and outputting the signal having the noise component.

Also, the noise level converting unit preferably comprises an amplifier for amplifying the output of the adder in the noise detecting unit to a predetermined level, and a DC converter for converting the output of the amplifier into a signal having a DC component.

An automatic channel matching method according to the present invention comprises the steps of:

(a) variably generating a carrier frequency from a low channel frequency to a high channel frequency by a predetermined frequency bandwidth in an automatic channel matching mode, loading an audio/video signal onto the generated carrier wave frequency, and providing the signal to signal processing means;

(b) performing coarse tuning until the level of the synchronizing signal included in the output signal from the output of the signal processing means is more than a predetermined amplitude with respect to the level of a noise signal also included therein;

(c) performing fine tuning according to the amount of a noise signal included in the output signal from the output of the signal processing means after completing the coarse tuning, whereby a user can view the audio/video signal loaded onto the carrier wave frequency via the currently viewed channel frequency of the signal processing means.

An automatic channel matching method according to the present invention connected between a VCR reproducing an audio/video signal from a recording medium and a TV including a tuner, signal processing means for processing an audio/video signal input via the tuner, and an output terminal outputting the output signal of the signal processing means externally, for variably or fixedly generating the carrier wave frequency for loading the audio/video signal from the VCR, so that the generated carrier wave frequency including the audio/video signal is automatically tuned to the channel frequency of the currently viewed TV, comprises the steps of:

(a) variably generating a carrier frequency from a low channel frequency to a high channel frequency by a predetermined frequency bandwidth when receiving a VCR 5 mode control signal, loading an audio/video signal onto the generated carrier wave frequency, and providing the signal to signal processing means;

(b) performing coarse tuning until the level of the synchronizing signal included in the signal output from 10 the output terminal of the TV is more than a predetermined amplitude with respect to the level of a noise signal included in the output signal of the output terminal of the TV;

(c) performing fine tuning according to the amount of a noise signal included in the output signal of the output terminal of the TV after completing the coarse tuning, whereby a user can view the audio/video signal loaded on the carrier wave frequency via the currently viewed channel frequency of the signal processing means.

BRIEF DESCRIPTION OF THE DRAWINGS

Other features and advantages of the present invention will become more readily understood from the following detailed description, taken in conjunction with the appended claims and attached drawings, in which:

FIGS. 2A to 2E are operational waveforms of five respective parts of FIG. 1.

DETAILED DESCRIPTION OF THE INVENTION

Figure 1:
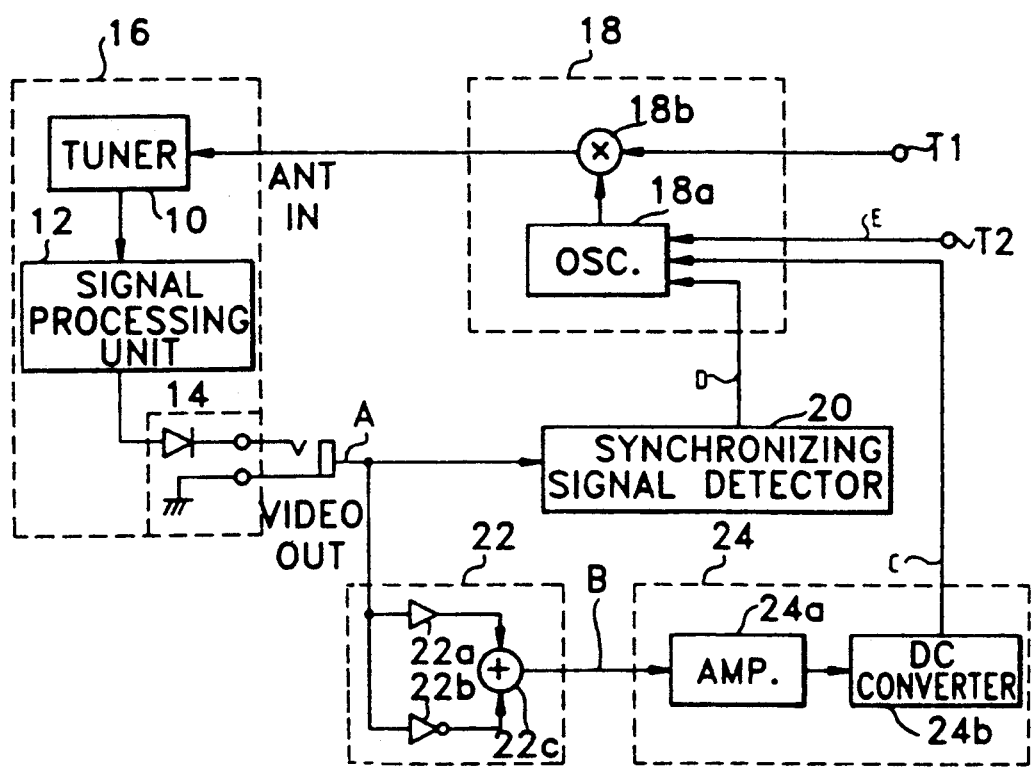
FIG. 1 is a block diagram of a automatic channel matching system according to the present invention.

Referring to FIG. 1, reference number 16 denotes a TV, which includes a tuner 10, a signal processing unit 12 for processing an audio/video signal input via the tuner 10, and an output terminal 14 for externally providing the output of the signal processing unit 12. Reference number 18 denotes an RF channel frequency altering unit, 20 denotes a synchronizing signal detector, 22 denotes a noise detecting unit, and 24 denotes a noise level converting unit.

When a viewer, who has been viewing any channel of the TV 16, wishes to view an audio/video signal produced from the VCR on the TV, a selecting switch (not shown) is switched to a VCR mode generating a VCR mode control signal. Then, the RF channel frequency altering unit 18 continuously and variably generates a carrier wave frequency shifted by a predetermined frequency bandwidth from a low to a high channel when receiving the VCR mode control signal through a second input terminal T2, and then loads the video signal, which is inputted through a first input terminal T1, onto the generated carrier wave frequency. The loaded video signal is supplied to the TV 16.

The RF channel frequency controlling unit 18 includes a carrier wave frequency oscillator 18a for generating carrier wave frequencies from a low channel to a high channel, and a multiplier 18b for multiplying the video signal received via the first input terminal T1 to the carrier wave frequency generated by carrier wave frequency oscillator 18a. Also, the carrier wave frequency oscillator 18a is connected to the second input terminal T2 in order to receive the VCR mode control signal. The video signal from the first input terminal T1, which is loaded onto the carrier wave frequency generated by the carrier wave frequency oscillator 18a, is applied to the tuner 10 of the TV 16. Thereafter, the tuner 10 tunes the carrier wave frequency out of the multiplied signal and transmits the video signal to the output terminal 14 via the signal processing unit 12. The outputted video signal is then supplied to the synchronizing signal detector 20 and the noise signal detecting unit 22.

The synchronizing signal detector 20 detects the synchronizing signal from the video signal output from the output terminal 14, and generates and supplies a signal of a predetermined level to the RF channel frequency altering unit 18. The noise signal detecting unit 22, which detects noise in the signal output from output terminal 14 of the TV 16, includes a buffer 22a for buffering the signal produced from the output terminal 14 of the TV 16, an inverting buffer 22b which buffers while inverting the signal output from the output terminal 14, and an adder 22c for adding the outputs of the buffer 22a and the inverting buffer 22b and for outputting a signal having a noise component.

The synchronizing signal detector 20 generates an output signal of a predetermined level which differs according to whether the signal output from RF channel altering unit 18 is loaded on a carrier frequency generated by the carrier frequency generator 18a. That is, when the video signal having a synchronizing signal is loaded on the carrier frequency, the video signal is output via the TV 16 and the synchronizing signal is detected by the synchronizing signal detector 20. However, the carrier frequency from the RF channel frequency altering unit 18 must be tuned to match that of the tuner 10 of the TV 16. In other words, even though the video signal is loaded on the carrier frequency, the video signal is not present at the output terminal 14 of the TV 16 unless its frequency matches that of the tuner 10. In this case, the synchronizing signal detector 20 cannot detect the synchronizing signal included in the video signal. Thus, a video signal is outputted having a different level than when a synchronizing signal is detected.

The noise signal level converting unit 24 amplifies the noise signal output from the noise signal detecting unit 22 to a predetermined level and converts the amplified signal into a signal having a DC component. For such a converting operation, the noise signal level converting unit 24 comprises an amplifier 24a for amplifying the noise signal output from the adder 22c to a predetermined level, and a DC converter 24b for converting the output of the amplifier 24a into the signal having a DC component.

When receiving a VCR mode control signal via the second input terminal T2, the channel frequency oscillator 18a of the RF channel frequency altering unit 18 first sets the carrier frequency to a frequency coarsely tuned to the currently viewed TV channel, according to the output of the synchronizing signal detector 20, and then, according to the output of the noise level converting unit 24, precisely sets the carrier frequency to be fine-tuned to the TV channel. By controlling an internal controlling device (not shown), the carrier wave frequency oscillator 18a continuously generates the frequency set first from the time when the output signal of the synchronizing signal detector 20 becomes higher than a predetermined amplitude, and is gradually operated to generate a carrier frequency tuned to the exact channel frequency of the TV 16 according to the level of a output signal obtained from the noise signal detecting unit 22 and the noise signal level converting unit 24. If the carrier wave frequency is not set exactly, significant noise is detected by the noise signal detecting unit 22, compared to a small amount of noise which is detected when the frequency is set exactly. When the noise is less than a predetermined amount, the carrier wave frequency oscillator 18a generates a steady carrier wave frequency.

FIGS. 2A-2E illustrate operational waveforms of the respective parts of FIG. 1, wherein FIG. 2A shows a waveform of the signal output from output terminal 14 of the TV 16, FIG. 2B shows a waveform of the output signal of the noise signal detecting unit 22, FIG. 2C shows a waveform of the output signal of the noise signal level converting unit 24, FIG. 2D shows a waveform of the output signal of the synchronizing signal detector 20, and FIG. 2E shows a waveform of the TV/VCR mode control signal. In FIG. 2A, a reference symbol N designates noise, VS designates a video signal, and SYNC designates a synchronizing signal. Also, in all of FIGS. 2A-2E, period t1 represents the time at which a video signal does not exist, and period t2 represents the time at which a video signal does exist.

Now, the operation of the present invention will be described in detail with reference to FIGS. 1 and 2A-2E.

When the channel of the tuner 10 has been selected to, for example, channel 6, a logic "high" VCR mode control signal (FIG. 2E) is input to the carrier wave frequency oscillator 18a via the second input terminal T2, and the carrier wave frequency oscillator 18a varies the carrier wave frequency from low to high by a predetermined frequency bandwidth for performing coarse tuning, to generate the various frequencies. (Here, the predetermined frequency bandwidth is preferably a channel frequency bandwidth, or 6 MHz.) The time required to match the generated channel frequency with channel 6, currently being viewed on the TV, will be a function of the tune time of the TV 16. For example, if the TV's tune time is about 0.8 seconds, the overall settling time will be roughly four seconds. Thus, the time required to match the generated channel frequency with the desired TV channel frequency may be shortened by reducing the tune time of the TV.

That is, the multiplier 18b adds a carrier frequency generated from the carrier wave frequency oscillator 18a to an audio/video signal received via the first input terminal T1, and supplies the multiplied signal to the tuner 10. At this time, if the channel frequency of the tuner 10 and the carrier frequency loaded with the video signal and output from the multiplier 18b do not match, then only a noise signal is output from the output terminal 14 for a period t1 as shown in FIG. 2A. The noise signal detecting unit 22 detects the noise signal from the output terminal 14 and generates a waveform such as that shown in FIG. 2B. The noise signal level converting unit 24 receives the signal generated from the noise signal detecting unit 22 and then outputs a DC signal corresponding to the received signal as shown in FIG. 2C. Meanwhile, the synchronizing signal detector 20 generates and supplies a +5 V DC signal, as shown in FIG. 2D, to the carrier wave frequency oscillator 18a of the RF channel altering unit 18. Then, since a ØV signal level is received from the synchronizing signal detector 20, the carrier wave frequency oscillator 18a continuously shifts the carrier wave frequency by a predetermined frequency bandwidth.

When the carrier wave frequency generated by the carrier wave frequency oscillator 18b and the channel frequency of the tuner 10 are matched by repeatedly performing the above operation, the video signal received via the first input terminal TI is tuned in the tuner 10 of the TV 16. The video signal tuned in the tuner 10 is supplied to the signal processing unit 12 which processes the supplied video signal and, thereafter, outputs the signal to the output terminal 14. Therefore, when the channel frequency of the TV 16 and the carrier wave frequency of the VCR producing the video signal are matched as described above, the video signal supplied to the TV 16 via the first input terminal T1 is output to the output terminal 14, after being processed therein. Then, a video signal VS including a synchronizing signal SYNC and a noise signal N during period t2 of FIG. 2A, is supplied to the synchronizing signal detector 20 and the noise signal detecting unit 22. When receiving the video signal VS the synchronizing signal detector 20 detects the synchronizing signal SYNC included in the video signal, generates a logic "high" signal (FIG. 2D), and supplies it to the carrier wave frequency oscillator 18a. At this time, the carrier wave frequency oscillator 18a generates a continuous, currently-tuned carrier wave frequency and maintains its frequency without change.

When the output signal of the synchronizing signal detector 20 is high, the level of the synchronizing signal detected in the synchronizing signal detector 20 becomes higher than a predetermined level with respect to the level of the noise signal included in the output signal from the output terminal 14. At this time, the ratio between the levels of the noise signal included in the output signal of output terminal 14, and of the synchronizing signal detected in the synchronizing signal detector 20 is preferably 1:0.45.

Meanwhile, the noise signal detecting unit 22 receives the signal output from the output terminal 14 of the TV 16 during period t2. This action helps the supply of the received video signal VS to the buffer 22a and the inverting buffer 22b which respectively perform a buffering and an inverse buffering operation on the same signal and furnish the buffered and inversely buffered signals to the adder 22c. The adder 22c receives and adds these furnished signals to generate the noise signal as shown in FIG. 2B, which was included in the video signal VS.

Even though the video signal including the noise signal output from the inverting buffer 22b and that output from the buffer 22a are exactly 180° out of phase, the respective noise signals included in the video signals are randomly phased. Therefore, though the output noise signals of the buffer 22a and inverting buffer 22b are added in the adder 22c, they do not offset each other, so that the noise signal detecting unit 22 still detects a noise signal.

In the noise signal level converting unit 24, the noise signal N (as shown in FIG. 2B) is amplified in the amplifier 24a and DC converter 24b. Then, the amplified noise signal, which is converted into a signal having a DC component, is supplied to the carrier wave frequency oscillator 18a which performs fine tuning by means of the output signal from the noise signal level converting unit 24. The fine tuning operation is performed until the output of the noise signal detecting unit is zero, that is, until the amount of noise is zero. At this time, the carrier wave frequency generator 18a of the RF channel frequency altering unit 18 generates a fined-tuned frequency by varying the carrier wave frequency within a predetermined frequency bandwidth with respect to the carrier frequency tuned during coarse tuning. Here, the predetermined frequency bandwidth is less than the channel frequency bandwidth, preferably ±2.5 MHz.

Therefore, the carrier wave frequency oscillator 18a generates any carrier wave frequency when enabled by a VCR mode signal, alters the carrier wave frequency by the output of the noise signal level converting unit 24, sets the carrier wave frequency by the output of the synchronizing signal detector 20, and matches the carrier wave frequency with any carrier wave frequency of the tuner 10 in the TV 16.

In the aforementioned embodiment of the present invention, the noise signal detecting unit 22 and the noise signal level converting unit 24 are used for fine tuning, but the object of the present invention can be achieved without the above two circuits.

As described above, according to the present invention, an automatic channel matching system varies the carrier wave frequency of a VCR producing a video signal according to the noise amount and the detection of a synchronizing signal, and then automatically matches the frequency of the VCR with that of the TV channel, so that a user needs not alter the TV channel from the currently selected channel.

What is claimed is:

1. An automatic channel matching system connected between a TV and a VCR which reproduces and processes a video signal from a recording medium, comprising:
    a first input terminal for receiving the video signal supplied from said VCR;
    a second input terminal for receiving a TV/VCR mode control signal;
    an RF channel frequency altering unit connected to said first and second input terminals, for generating a carrier wave frequency to coarsely tune and then finely tune the received video signal, loading the video signal on said generated carrier wave frequency, and transmitting said loaded video signal to said TV; and
    a synchronizing signal detector connected to an output terminal of said TV for detecting a synchronizing signal in the signal outputted of said output terminal, wherein said carrier wave frequency of said RF channel altering unit is accorded with the currently viewed TV channel frequency in response to said synchronizing signal detected in the synchronizing signal detector, so that a user can view the output of said VCR via a currently selected TV channel.

2. The automatic channel matching system as claimed in claim 1, wherein said RF channel frequency altering unit comprises:
    a carrier wave frequency oscillator connected to said second input terminal, for variably generating a carrier wave frequency from a low channel to a high channel upon receiving said VCR mode control signal and then for generating the carrier wave frequency to perform said coarse tuning upon receiving a signal within a predetermined level from said synchronizing signal detector; and
    a multiplier for multiplying the video signal received via said first input terminal with the carrier wave frequency generated from said carrier wave frequency oscillator and transmitting said multiplied signal to said tuner of said TV.

3. An automatic channel matching system as claimed in claim 1 or 2, wherein said RF channel frequency altering unit comprises means for fixedly generating a carrier wave frequency tuned to the currently viewed TV channel frequency when the level of the synchronizing signal detected from said synchronizing signal detector is more than a predetermined amplitude with respect to the level of a noise signal included in the output of said output terminal of said TV, thereby completing a tuning operation.

4. An automatic channel matching system as claimed in claim 3, wherein the ratio of the levels of a noise signal included in the output signal of said output terminal of said TV and a synchronizing signal detected in said synchronizing signal detector is 1:0.45.

5. An automatic channel matching system as claimed in claim 1 or 2, wherein said RF channel frequency altering unit comprises means for variably generating a carrier wave frequency from a low channel frequency to a high channel frequency by a predetermined frequency bandwidth during said coarse tuning.

6. An automatic channel matching system as claimed in claim 3, wherein said RF channel frequency altering unit comprises means for variably generating the carrier wave frequency from a low channel frequency to a high channel frequency by a predetermined frequency bandwidth during said coarse tuning.

7. An automatic channel matching system as claimed in claim 1 or 2, further comprising:
    a noise signal detecting unit connected to said output terminal of said TV for detecting only a noise signal among the output signal from said output terminal of said TV; and
    a noise level converting unit for amplifying the noise signal detected by said noise signal detecting unit to a predetermined level, and for converting the amplified noise signal into a signal having a DC component,
    wherein said RF channel altering unit generates a carrier wave frequency for fine tuning in response to the outputs of said noise level converting unit.

8. An automatic channel matching system as claimed in claim 2, wherein said RF channel frequency altering unit comprises means for variably generating the carrier wave frequency within a predetermined frequency bandwidth range with respect to the carrier wave frequency fixedly generated during said coarse tuning operation.

9. An automatic channel matching system as claimed in claim 5, wherein said RF channel frequency altering unit comprises means for variably generating the carrier wave frequency within a predetermined frequency bandwidth range with respect to the carrier wave frequency fixedly generated during said coarse tuning operation.

10. An automatic channel matching system as claimed in claim 8, wherein said frequency bandwidth range is ±2.5 MHz.

11. An automatic channel matching system as claimed in claim 7, wherein said noise signal detecting unit comprises:
    a buffer for buffering the output signal from said output terminal of said TV;
    an inverting buffer for buffering while inverting the output signal from said output terminal of said TV; and
    an adder for adding the outputs of said buffer and inverting buffer and outputting the added signal having a noise component.

12. An automatic channel matching system as claimed in claim 7, wherein said noise level converting unit comprises:

an amplifier for amplifying the output signal from said adder of said noise signal detecting unit to a predetermined level; and a DC converter for converting the output of said amplifier into a signal having a DC component.

13. An automatic channel matching method comprising the steps of:

(a) variably generating a carrier frequency from a low channel frequency to a high channel frequency by a predetermined frequency bandwidth in an automatic channel matching mode, loading an audio/video signal on to said generated carrier wave frequency, and providing the signal to a signal processing means;

(b) coarse tuning until the level of the synchronizing signal included in the output signal from an output of said signal processing means is more than a predetermined amplitude with respect to the level of a noise signal also included therein; and (c) fine tuning according to the amount of noise in the output signal from the output of said signal processing means after completing said coarse tuning, wherein a user can view the audio/video signal loaded onto said carrier wave frequency via the currently viewed channel frequency of said signal processing means.

14. An automatic channel matching method as claimed in claim 13, further comprising the steps of:

buffering the output signal from the output of said signal processing means during said step of fine tuning;

inverting and buffering the output signal; and adding said buffered signal and said inverted buffered signal to detect only a noise signal among the output signal from said signal processing means.

15. An automatic channel matching method as claimed in claim 13, wherein said step of coarse tuning comprises the step of fixedly generating the carrier wave frequency tuned to the currently viewed channel frequency via said signal processing means.

16. An automatic channel matching method as claimed in claim 13, wherein said step Of fine tuning is completed when the amount of said noise signal reaches a predetermined amount.

17. An automatic channel matching method as claimed in claim 13, wherein said step of fine tuning comprises the step of variably generating the carrier wave frequency within a predetermined frequency bandwidth range with respect to the carrier wave frequency fixedly generated during said step of coarse tuning.

18. An automatic channel matching method as claimed in claim 17, wherein said frequency bandwidth range is ±2.5 MHz.

19. An automatic channel matching method as claimed in claim 13, wherein said step of coarse tuning comprises the step of variably generating the carrier wave frequency by the channel frequency bandwidth of said signal processing means.

20. An automatic channel matching method as claimed in claim 13, wherein the channel frequency bandwidth of said signal processing means is 6 MHz.

21. An automatic channel matching method to be applied to an automatic channel matching system connected between a VCR which reproduces and outputs a video signal from a recording medium, and a TV including a tuner, signal processing means for processing the video signal input via said tuner, and an output terminal for outputting the output of said signal processing means externally, for variably or fixedly generating a carrier wave frequency loaded with the video signal from said VCR, so that the generated carrier wave frequency including said video signal is automatically tuned to the channel frequency o said currently viewed TV, comprising the steps of:

(a) variably generating a carrier frequency from a low channel frequency to a high channel frequency within a predetermined frequency bandwidth when receiving a VCR mode control signal, loading an audio/video signal onto said generated carrier wave frequency, and outputting the signal to said signal processing means;

(b) coarse tuning until the level of the synchronizing signal included in the signal output from said output terminal of said TV is more than a predetermined amplitude with respect to the level of noise in the output of said output terminal; and (c) fine tuning according to the amount of noise detected in the output signal of the output terminal of said TV after completing said coarse tuning, wherein a user can view the audio/video signal loaded on said carrier wave frequency via the currently viewed channel frequency of said signal processing means.

22. An automatic channel matching method as claimed in claim 21, comprising the steps of;

buffering the output signal from the output terminal of said signal processing means during said step of fine tuning;

inverting and buffering the output signal; and adding said buffered signal and said inverted buffered signal to detect only a noise signal among the output signal of the output terminal of said signal processing means.

23. An automatic channel matching method as claimed in claim 21, wherein said step of coarse tuning comprises the step of fixedly generating the carrier wave frequency to the channel frequency currently viewed via said signal processing means.

24. An automatic channel matching method as claimed in claim 21, wherein said step of fine tuning is completed when the amount of said noise signal reaches a predetermined amount.

25. An automatic channel matching method as claimed in claim 21 or 23, wherein said step of fine tuning comprises the step of variably generating the carrier wave frequency within a predetermined frequency bandwidth range with respect to the carrier wave frequency fixedly generated during said step of coarse tuning.

26. An automatic channel matching method as claimed in claim 25, wherein said frequency bandwidth range is ±2.5 MHz.

27. An automatic channel matching method as claimed in claim 21, wherein said step of fine tuning comprises the step of variably generating the carrier wave frequency within a predetermined frequency bandwidth range with respect to the carrier wave frequency fixedly generated during said step of coarse tuning.

28. An automatic channel matching method as claimed in claim 27, wherein said frequency bandwidth range is ±2.5 MHz.

* * * * *